(12) United States Patent
Macomber et al.

(10) Patent No.: US 6,696,311 B2
(45) Date of Patent: Feb. 24, 2004

(54) INCREASING THE YIELD OF PRECISE WAVELENGTH LASERS

(75) Inventors: Stephen Henry Macomber, Tucson, AZ (US); Yeong-Ning Chyr, Tucson, AZ (US); James Rusciano, Tucson, AZ (US)

(73) Assignee: Spectra-Physics Semicond. Lasers, In, Tucson, AZ (US)

( * ) Notice: Subject to any disclaimer, the term of this patent is extended or adjusted under 35 U.S.C. 154(b) by 0 days.

(21) Appl. No.: 10/227,033

(22) Filed: Aug. 24, 2002

(65) Prior Publication Data

US 2003/0020074 A1 Jan. 30, 2003

Related U.S. Application Data

(63) Continuation-in-part of application No. 09/848,529, filed on May 3, 2001, now Pat. No. 6,455,341.

(51) Int. Cl.[7] ............................................. H01L 21/00
(52) U.S. Cl. ............................................ 438/32; 438/47
(58) Field of Search ................... 372/47; 438/32, 438/47

(56) References Cited

U.S. PATENT DOCUMENTS

| | | | | |
|---|---|---|---|---|
| 4,178,604 A | * | 12/1979 | Nakamura et al. ............ 372/96 |
| 5,329,542 A | * | 7/1994 | Westbrook .................... 372/96 |
| 5,537,432 A | * | 7/1996 | Mehuys et al. ............... 372/50 |
| 5,838,854 A | * | 11/1998 | Taneya et al. ................ 385/50 |
| 5,852,625 A | * | 12/1998 | Takahashi ..................... 372/96 |
| 5,991,322 A | * | 11/1999 | Takiguchi et al. ............ 372/50 |
| 6,363,092 B1 | * | 3/2002 | Botez et al. .................. 372/43 |
| 2001/0046245 A1 | * | 11/2001 | Funabashi et al. ............ 372/43 |
| 2002/0027938 A1 | * | 3/2002 | Huang ......................... 372/96 |

* cited by examiner

*Primary Examiner*—Wael Fahmy
*Assistant Examiner*—William C. Vesperman
(74) *Attorney, Agent, or Firm*—Howard R. Popper

(57) ABSTRACT

A wafer supporting a semiconductor structure having a material gain function that would preferentially support an Fabry-Perot laser mode at an unwanted wavelength $\lambda 2$ is provided with a second-order dielectric grating located sufficiently remotely from the high intensity optical field of the quantum well and the waveguide layers to receive just enough transverse mode energy to provide feedback to reduce the gain at $\lambda 2$ and support oscillation at a desired wavelength $\lambda 1$. More particularly, by locating the grating in an unpumped area not requiring epitaxial overgrowth and so as to provide a gain discrimination factor $\Delta g \approx 0.1$ cm$^{-1}$ at the desired wavelength $\lambda 1$, the fraction of power lost to transverse mode radiation can be held to about 1% which is sufficient to provide stabilizing feedback without sapping too much energy from the longitudinal beam.

14 Claims, 3 Drawing Sheets

INCREASING THE YIELD OF PRECISE WAVELENGTH LASERS

REFERENCE TO RELATED APPLICATION

This is a continuation-in-part of application Ser. No. 09/848,529 filed May 3, 2001 now U.S. Pat. No. 6,455,341 entitled "Increasing the Yield of Precise Wavelength Lasers".

FIELD OF THE INVENTION

This invention relates to longitudinal mode laser diodes and, more particularly, to achieving higher yields of devises lasing at a desired wavelength.

BACKGROUND OF THE PRIOR ART

Existing semiconductor laser fabrication processes have difficulty in achieving devices that oscillate at a precise wavelength. One of the contributing factors is a variation of the material gain function that may arise during epitaxial crystal growth. Typical variation in lasing wavelength of lasers made from different growths may amount to +/− 5 nm. However many applications require lasers to have a wavelength accuracy of +/− 1 nm or better, e.g., for the optical pumping of Nd:YAG lasers at 808 nm. Other factors such as stress, temperature and thermal non-uniformities often cause additional variable shifts. The mismatch between the achievable wavelength variation and end-user specifications has led to difficulties in achieving desirable manufacturing yields.

The most common type of laser diode structure is the single quantum well which uses a ternary or quaternary material such as AlGaAs or GaInAsP in which a narrow bandgap, optically active, thin layer (~0.05 $\mu$m thick) is sandwiched between a pair of thicker, wider-bandgap waveguide and cladding layers. A semiconductor, edge-emitting (longitudinal mode) diode laser typically includes a resonator formed of a solid state laser gain medium extending longitudinally between input and output mirror surfaces usually formed by cleaving. The distance between the facets defines a F-P (F-P) cavity which is capable of sustaining several different longitudinal lasing modes. The gain medium is typically enclosed on laterally adjacent sides by reflective material having an index of refraction $n_2$ which is greater than the index of refraction $n_1$ of the gain medium material.

To improve wavelength stability, feedback can be provided by locating a first or second-order grating of suitable pitch either within the gain region of the solid state structure (for the DFB laser), or externally thereto (for the DBR laser). For example, U.S. Pat. No. 4,178,604 issued Dec. 11, 1979 shows a laser diode operating at 0.875 $\mu$m stabilized by a first order grating having a pitch $\Lambda$=0.123 $\mu$m and an index of refraction n≅3.55 located between the active layer (n=3.6) and another layer (n=3.36). The grating is etched in a process using ultraviolet light to holographically etch a semiconductor layer located 0.3 $\mu$m away from the 0.1 $\mu$m thick active layer and having a refractive index lower than that of the active layer using interfering ultra-violet beams. The grating can be termed a "first order" grating since the pitch $\Lambda$=0.123 $\mu$m is related to the desired laser wavelength $\lambda$=0.875 $\mu$m by $\Lambda$=$\lambda$/2n. Unfortunately, ultraviolet light holography requires extensive measure to prevent unwanted carbon coating of optics due to photolyzation of organic vapors in the air which generally dictates that the process be performed in an extensively purged environment. Moreover, the surface of the mirror used to reflect the interfering waves must be extremely smooth to avoid unwanted scattering that would detract from the precise exposure of the photoresist, scattering being proportional to the inverse-fourth power of the wavelength of light employed. Finally, UV lasers are notoriously unreliable. It would be extremely desirable to obtain a manufacturing process that did not require the use of lasers that produce UV light.

Another example of a DFB laser appears in vol. 18 Electronics Letters for Jan. 7, 1982, at pp. 27, 28 which shows a GaInAsP/InP laser operating at a wavelength of 1.5 $\mu$m using a second order grating ($\Lambda$=0.4522$\mu$) etched into an n-InP substrate. The grating was buried in a heterostructure comprised of a 0.17 $\mu$m thick waveguide layer of Sn-doped, n-GaInAsP adjacent to a non-doped, 0.19 $\mu$m thick GaInAsP active layer. To suppress unwanted F-P, modes the rear facet of the cavity was inclined.

U.S. Pat. No. 4,704,720 issued Nov. 3, 1987 asserted that the grating used in the aforementioned laser was located too far away from (i.e., too weakly coupled to) the optical field so that, at certain values of the injected current, oscillation at the unwanted Fabry-Perot modes occurred instead of at the desired single wavelength. Accordingly, the '720 patent laser, operating at an exemplary wavelength of 1.3 $\mu$m, located its second-order grating (having a pitch of $\Lambda$=0.4$\mu$) in the strongest part of the optical field to obtain oscillation in a single longitudinal mode. Alternatively, a first order grating having a finer pitch ($\Lambda$=0.2$\mu$) was suggested.

While a second-order grating can be produced using lower energy blue light beams in the photolithographic process, second-order gratings located in the high intensity optical field of the active layer or of the waveguide layer give rise to diffraction orders that sap energy from the single desired longitudinal mode. It would, however, facilitate ease of manufacture if blue light beams could be used to produce second-order gratings on wafers made from production runs of crystal growths having reasonable variation in their material gain function without incurring the penalty of energy loss through surface-diffraction losses. Wavelength stability is especially desirable at 0.808 $\mu$m which is the wavelength required to optically pump Nd:YAG lasers. One conventional arrangement has 19 laser gain stripes per bar so that it can be coupled to a bundle of 19 optical fibers, the output of which can be conveniently coupled into the Nd:YAG laser rod. It would be desirable to obtain a laser bar having sufficient wavelength stability among a comparable number of diodes on the bar to drive the fiber bundle.

In the copending application entitled "Increasing The Yield Of Precise Wavelength Lasers", Ser. No. 09/848,529, filed May 3, 2001, there is disclosed an arrangement for overcoming the material gain function of the semiconductor material of the wafer that would tend to lase at an unwanted wavelength, $\lambda$2. A second-order dielectric grating was embedded between epitaxial, gain-providing layers having different indices of refraction. The layer in which the grating was etched was located at a distance sufficiently remote from the high intensity optical field of the waveguide to provide just enough feedback to reduce the gain at the unwanted $\lambda$2 wavelength and yet support oscillation at a desired wavelength $\lambda$1 without incurring excessive surface diffraction loss. In the aforementioned patent application, feedback from the grating effected a gain discrimination factor, $\alpha$ having an order of magnitude of 0.1 cm$^{-1}$. The embedded grating provided stabilizing feedback and reduced the fraction of power lost to surface diffraction to less than 1 percent. When the wafer was processed into F-P laser devices, the coated facets provided most of the feedback, while the feedback from the grating altered the F-P longitudinal mode spectrum to create a preferred resonance condition.

While the aforementioned copending application provided a way to increase the yield of lasers having a precise wavelength, difficulties were encountered in growing the necessary epitaxial gain-providing layers over the etched grating layer. As is well known, growing epitaxial semiconductor layers that will exhibit the characteristics of a single crystal requires that extreme care be taken with respect to the surface on which the layers are to be grown. Unfortunately, etching processes tend to leave behind various oxides and impurities as well as surface defects that prevent the formation of single crystal growth structures on a disturbed surface. Moreover, the direction in which the grating lines are etched can also contribute to difficulties in obtaining overgrowth with precise characteristics.

To achieve the wavelength stability described in the aforementioned application, the grating lines were etched in the direction parallel to the emitting facet, i.e. in the "$0\overline{1}\overline{1}$", direction, throughout the longitudinal dimension of the laser. Depending on the etchant and processing techniques employed, etching the grating lines in "$0\overline{1}\overline{1}$" direction, produces "dovetail" grooves rather than "v" grooves. Difficulties have been experienced in growing semiconductor layers having precisely defined semiconductor overgrowth over a layer having a grating defined by dovetail grooves.

While it would be possible to orient the wafer so that the grating lines could be etched in the v-groove direction, this would entail disruption of the usual process in which a bar containing multiple laser emitters is formed from a semiconductor wafer. In such a process, v-grooves need to be etched between the lasers on the wafer (i.e., perpendicular to the laser facets) in order to prevent parasitic lasing along the "width" or transverse direction of the bar. If the v-grooves are to be etched perpendicular to the facets, then the gratings etched parallel to the facet will be dovetail grooves. Accordingly, one who would fabricate wavelength stable lasers is faced with the dilemma of either changing the laser bar fabrication process or of etching the grating lines in a direction that impedes proper epitaxial growth of semiconductor layers over the grating layer.

SUMMARY OF THE INVENTION

In accordance with the principles of the present invention, a conventional process of fabricating laser bars from a wafer may be employed in which the diodes of the bar are separated from each other by v-grooves etched perpendicular to the facets to prevent lasing in the direction transverse of the bars. A grating will be etched into a cladding layer for a short distance beyond the end of the gain stripe of each diode on the bar. Having a length advantageously only about ten percent of the distance between the facets, or shorter, and lying beyond the end of the gain stripe, the grating is located in an unpumped region of the laser. The grating so located may advantageously be etched using a process that results in "dovetail" etching since the grating need not be overgrown with gain-providing epitaxial layers. The short grating is located at an appropriate distance away from the waveguide region, beyond either or both ends of the gain stripe, but preferably near the highly reflective (rear) facet of the F-P cavity. The grating so located will scatter less optical energy because of the lower optical intensity existing at the rear facet than at the low reflectivity (front) facet. Since the grating length is one-tenth the length of the embedded grating used in the aforementioned copending application, the feedback gain discrimination factor, $\alpha$, should be ten times larger, e.g., $\alpha \approx 1.0$ cm$^{-1}$ than when an embedded, full-length grating is employed. This will hold the fraction of power lost to surface diffraction radiation to about 1%, which is sufficient to provide stabilizing feedback without sapping too much energy from the longitudinal beam.

BRIEF DESCRIPTION OF THE DRAWING

FIGS. 1 through 4 recapitulate the drawing of the above-mentioned copending application in which FIG. 1 illustrates the material gain function of a wafer that will preferentially support an F-P oscillation mode at a desired wavelength $\lambda 1$;

FIG. 2 shows the material gain function of a wafer that will preferentially support an F-P oscillation mode at an undesired wavelength $\lambda 2$;

FIG. 3 shows the wavelength pulling effect $\delta$ of a second-order grating which reduces the gain at $\lambda 2$ by $\alpha$ to preferentially support an F-P oscillation at a wavelength of $\lambda 1$;

FIG. 4 shows a semiconductor structure built on a wafer having the material gain function of FIG. 2 including a grating located where the field strength is sufficient to provide a gain discrimination factor $\alpha \approx 0.1$ cm$^{-1}$ at the desired wavelength of $\lambda 1$;

FIG. 6-1 is a side view of a semiconductor wafer before being processed to provide the grating of FIG. 5; and FIG. 6-2 is an isometric view of the of the semiconductor wafer after it has been etched to provide the short grating in a non-pumped area beyond the end of the gain stripe in accordance with the invention;

GENERAL DESCRIPTION

Figure 1:
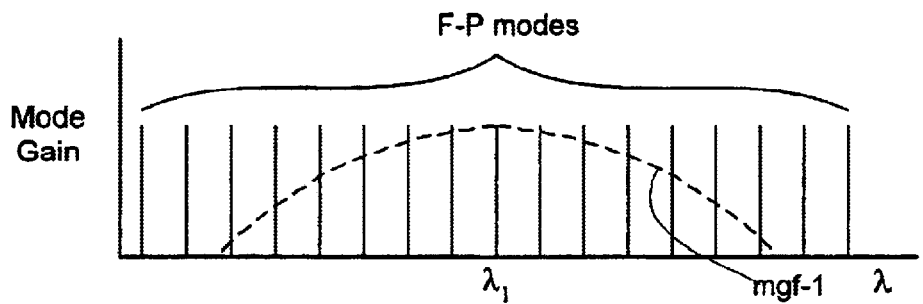
Figure 2:
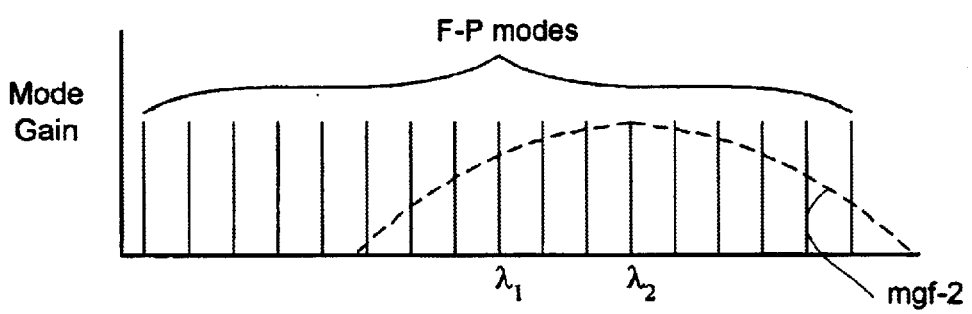
Figure 3:
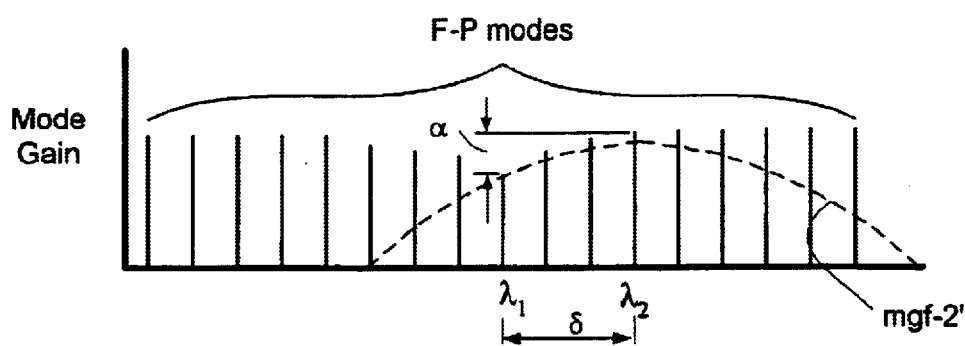
Figure 4:
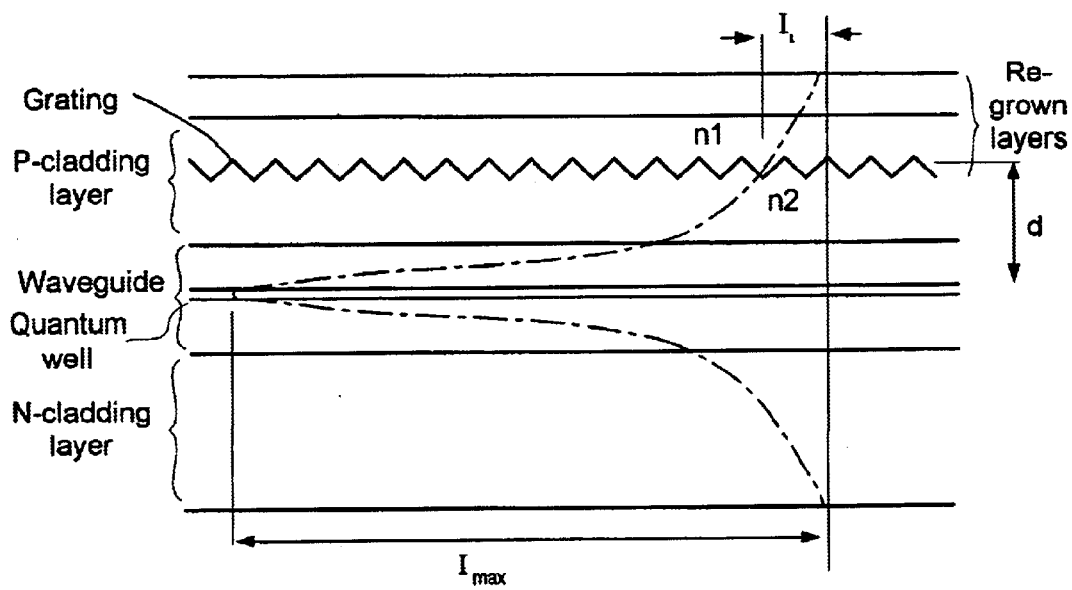
Figure 5:
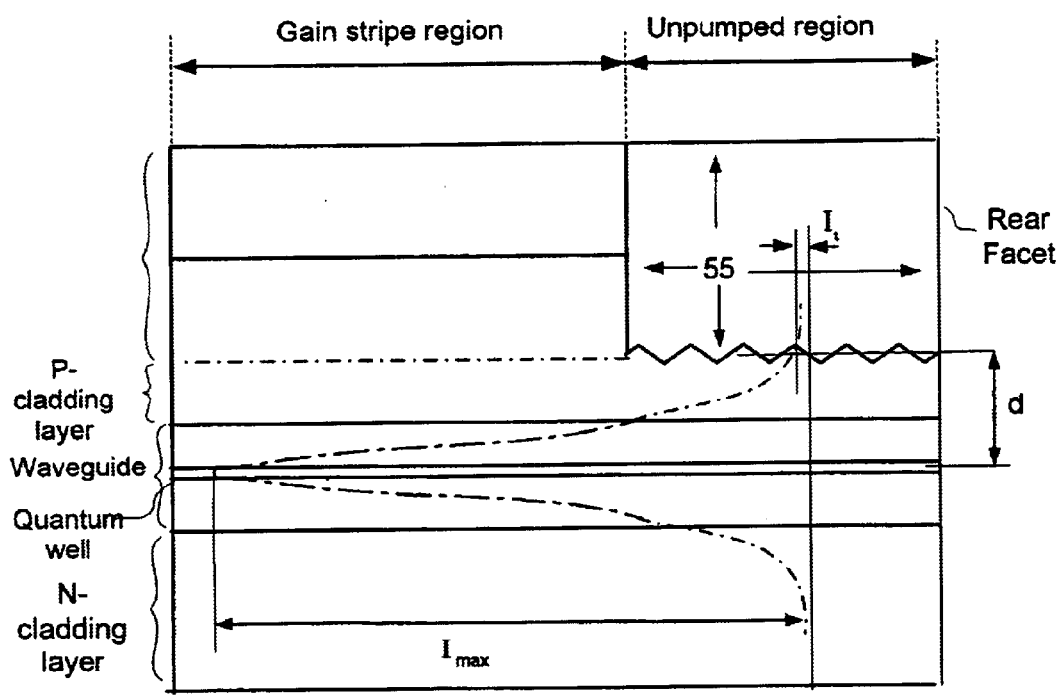
FIG. 5 illustrates the location of short grating to achieve the benefits of the present invention.

FIGS. 1 through 4, depict subject matter covered in the above-mentioned co-pending application, but will now be reviewed to provide pertinent background information. FIGS. 1 through 3 are plots of semiconductor materials exhibiting different material gain functions semiconductor materials when employed in an F-P cavity. An F-P cavity may be capable of sustaining lasing at any of several modal wavelengths. The plots illustrate that each of the modes requires substantially the same gain to support oscillation. When a laser diode first starts oscillating after receiving a current pulse, it may initially generate several orders of resonant lines, with the order nearest the peak of the material gain function becoming dominant. This central order will then remove energy from the side orders, provided the diode is so designed, and the central line will become increasingly narrower, although with some drift.

FIG. 1 shows that as the drive current applied to a semiconductor cavity structure built on a wafer having the desired material gain function is increased, the material gain function mgf-1 rises until its peak intersects the gain required to sustain oscillation at wavelength $\lambda 1$ among the variety of possible F-P modes. Unfortunately, the yield of wafers that can be cut from a crystal having exactly the desired mgf-1 characteristics may, in practice, be quite low. A typical wafer, for example, may have a material gain function mgf-2, shown in FIG. 2 that would, when incorporated in a semiconductor structure similar to that used for FIG. 1, tend naturally to sustain oscillation at the undesired wavelength $\lambda 2$. Such a wafer would not be usable for the purpose intended.

FIG. 3 shows that, as the current drive increased, the material gain function curve mgf-2 rises and intersects the gain for oscillation at λ1 before it intersects the gain required to sustain oscillation at λ2. In practice, photoluminescence can be used to estimate whether or not the gain peak is close enough to the target wavelength for the grating to "pull" it over. The F-P mode requiring lowest gain will be the first to start lasing and, once established, will preempt lasing at other modes (i.e., the gain curve stops rising once threshold is achieved). Accordingly, the mode at wavelength $\lambda_1$ will take over and predominate, having pulled it over a distance δ, illustratively +/− 4 nm.

The condition shown in FIG. 3 can be achieved using a second-order grating to provide the wavelength stabilizing feedback. It is important not to use too much feedback as this will give rise to unwanted surface radiation loss. To obtain the correct amount of feedback refer to FIG. 4. Let $\Gamma_i$ represent the fraction of the optic field intensity that is to be present at the layer i where the grating is to be located, i.e., $$\Gamma_i = \frac{\int_i I dx}{\int_{-\infty}^{\infty} I dx} \quad (1)$$

where x is in the direction perpendicular to the epitaxial layers. Next, consider that each grating groove acts as if it were a weak mirror. If the grating lies between layers having indices of refraction n1 and n2, the reflectivity, R, at each groove is given by:

$$R = \left|\frac{n_1 - n_2}{n_1 + n_2}\right|^2 \approx \left|\frac{\Delta n}{2n}\right|^2 \quad (2)$$

Let it be assumed that the grating-diffraction coefficient, i.e., the fraction of reflected optic field per groove Λ (measured in inverse centimeters, cm$^{-1}$) can be approximated as α:

$$\alpha = \frac{\Gamma_i R}{\Lambda} = \frac{\Gamma_i \left|\frac{\Delta n}{2n}\right|^2}{\Lambda} \quad (3)$$

Illustratively, let it be assumed that a α=0.1 cm$^{-1}$, and let us calculate the value of $\Gamma_l$ using typical values for Δn=0.05, and n=3.3. From equation (2), it turns out that R =5.7×10$^{-5}$. Rearranging the terms in equation (3) yields:

$$\Gamma_i = \frac{\alpha \Lambda}{R} = \frac{0.1 \times 0.2 \times 10^{-4}}{5.75 \times 10^{-5}} = 0.035. \quad (4)$$

The periodicity of a second-order grating chosen to achieve the illustrative operating wavelength λ=808 nm dictates a pitch Λ=λn ≈240 nm. When the second-order grating provides a grating-diffraction coefficient α≈0.1 cm$^{-1}$, the fraction of power lost to surface radiation (perpendicular to the planes of the waveguide layers) can be estimated from (1−e$^{-\alpha L}$) ≈0.02 or 2%, where L ≈2 mm is the cavity length. Using a more sophisticated numerical model, it has been determined that the radiation power loss is actually much less than one percent due to optical interference in the diffraction radiation between the counter-propagating waves within the guide. Thus, a second-order grating with α≈0.1 cm$^{-1}$ would not cause a significant surface radiation loss and could be more easily manufactured than a first order grating.

While the aforementioned procedure works well, it entails the use of somewhat onerous procedures in overgrowing the embedded grating with epitaxial semiconductor gain layers having the specified difference in indices of refraction over a grating which runs the entire length of the laser cavity between the facets. In accordance with the principles of the present invention, a shorter grating, illustratively having a length that is only one-tenth the length of the laser cavity, is used. The shorter grating is located in an unpumped region beyond the gain stripe so that there is no need to overgrow gain-providing epitaxial layers of variously doped semiconductor material. Further, since such gain-providing layers are eliminated, the grating may be etched with etchants that produce a dovetail cross-section and may then be covered simply with an insulating layer (55) of SiO$_2$ rather than gain-providing layers. Since the grating length is one-tenth the length of the embedded grating used in the aforementioned copending application, the grating diffraction coefficient, α, should be ten times larger than when an embedded, full-length grating is employed, e.g., α≈1.0 cm$^{-1}$. This will hold the fraction of power lost to surface diffraction radiation to about 1%, which is sufficient to provide stabilizing feedback without sapping too much energy from the longitudinal beam.

Figures 1, 2, 6:
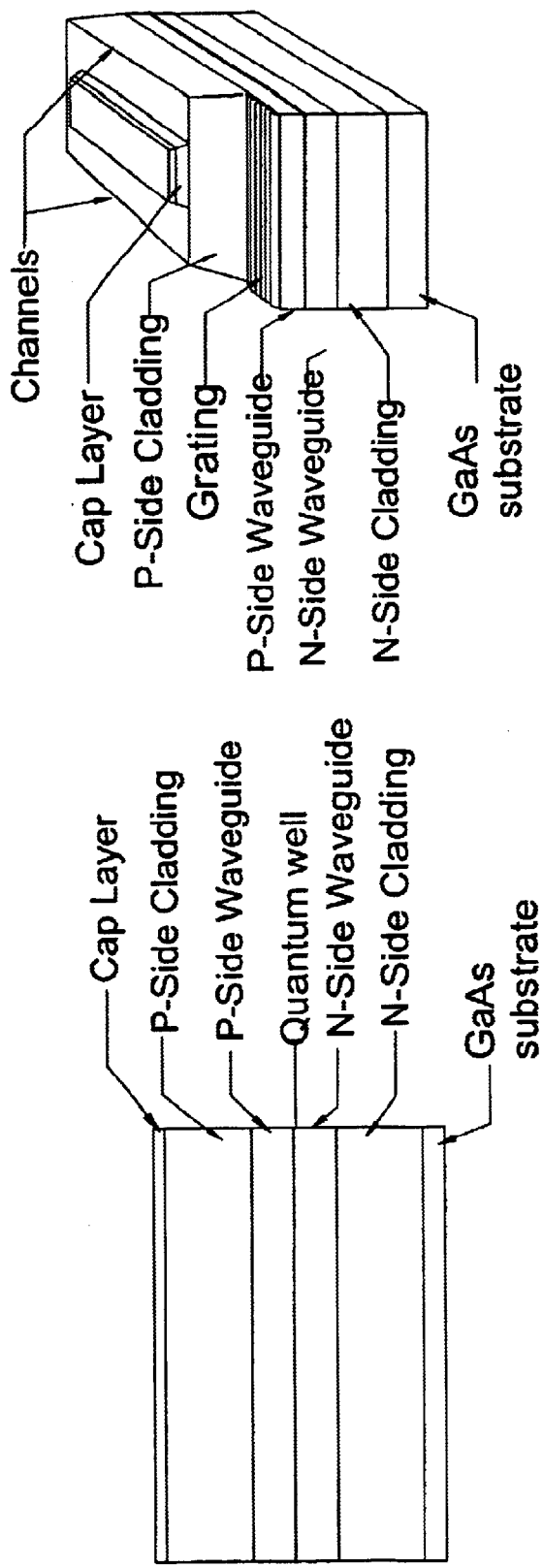

To effect the shorter grating in an unpumped area of the laser, one starts with a wafer having a typical number of gain layers, such as is illustrated in FIG. 6-1. The wafer will be subjected to a series of steps including masking, holographic exposure and etching to provide a short grating at the end of the gain stripe shown in isometric view in FIG. 6-2 to provide wavelength stabilizing feedback in accordance with the invention. Thereafter, an insulating layer of SiO2 and a conventional series of metallic contact layers (not shown in FIG. 6-2) will be added. For example, a "mesa" or "stripe" structure may first be etched into the wafer to confine the drive current to a defined area to establish a desired current density and limit edge effects to achieve efficient stimulated emission. Etchants will down cut through portions of the layers along the sides of the mesa to be defined and also at an end of the mesa where the surface relief grating is to be formed.

Next, steps are taken to define a "channel" structure at the sides of each laser on the wafer to confine carrier injection that will prevent parasitic emission in the lateral direction. Thereafter, further masking and etching operations are performed to etch a "window" at the end of the mesa (gain stripe) structure to provide an opening for fabricating the surface grating structure in a cladding layer at the appropriate distance from the waveguide layer. The grating is produced by exposing the resist coated wafer to an Argon laser to form ¼ micron fine periodic grating pattern. After the photoresist is developed, gas plasma etching technique is advantageously employed to define the gratings in the cladding layer. The mesa structure, channel and grating window are covered with photoresist to prevent these structures from being attacked by the plasma etching process. An insulating SiO$_2$ layer is applied to the entire wafer by a contact window process and a BOE etchant is applied to remove the SiO$_2$ layer on the mesa area so that metal deposition can be applied to serve as an electrical contact stripe.

The foregoing describes an illustrative embodiment of the invention. Further and other modifications may be made by those skilled in the art without, however, departing from the spirit and scope of the invention.

What is claimed is:

1. A method of increasing the yield of semiconductor laser devices comprising the steps of:
   a. forming a layered structure on a wafer exhibiting a material gain function region capable of sustaining oscillation at a number of F-P modes, said material gain function normally giving rise to oscillation at a wavelength of λ2; and b. etching a second-order grating on one of the layers of said structure lying wholly in an unpumped area outside said gain region of said structure where the optical field strength is sufficient to provide feedback to stabilize the wavelength at λ1 without creating surface diffraction loss greater than 5 %;

c. forming a dielectric material layer, instead of semiconductor epitaxial layers, in direct contact with and overlying the length of said grating.

2. A method according to claim 1 wherein said grating has a length that is a small fraction of the distance between the facets of said laser device, said grating exhibiting a feedback gain discrimination factor α at a wavelength of λ1 in the range of 0.05 to 1.0 cm$^{-1}$ and preferably of about 0.10 cm$^{-1}$.

3. A method according to claim 1 wherein said grating exhibits a feedback pain discrimination factor α having a value in the range of 0.5 to 5 cm$^{-1}$.

4. A method of increasing the yield of semiconductor laser devices giving rise to oscillation at a wavelength of λ1, comprising the steps of:

a. forming a layered structure including a quantum well and waveguide layers on a wafer exhibiting a material gain function region capable of sustaining oscillation at various F-P modes, said material gain function normally giving rise to oscillation at a wavelength of λ2;

b. creating a second-order grating outside said gain region to stabilize longitudinal emission at a wavelength of λ1 without creating a surface diffraction loss greater than 5%;

c. forming a dielectric material layer, instead of semiconductor epitaxial layers, in direct contact with and overlying the length of said grating.

5. A method according to claim 4 wherein said grating is etched into a layer having an optical field strength less than one ten-thousandth of the field strength of the quantum well and waveguide layers.

6. A method according to claim 4 wherein said grating provides a feedback gain discrimination factor α of 0.1 cm$^{-1}$ between wavelengths of λ2 and λ1.

7. A method of increasing the yield of semiconductor laser devices according to claim 4 wherein the feedback gain discrimination factor α has a value not greater than which is sufficient to pull the wavelength over a range of approximately +/− 5 nm.

8. A method of increasing the yield of semiconductor laser devices comprising the steps of:

a. forming on a wafer a layered structure including a quantum well and waveguide layers exhibiting a material gain function capable of sustaining oscillation at a number of F-P modes, said structure having a material gain function normally giving rise to oscillation at a wavelength of λ2;

b. etching one of said layers in a process including blue light holography to produce a second-order grating thereon; said one of said layers being located away from said quantum well and waveguide layers in an unpumped area outside the gain region so as to receive sufficient fringe field strength to provide a feedback gain discrimination factor α having a value of approximately 1.0 cm$^{-1}$ between wavelengths of λ2 and λ1.

9. A method of increasing the yield of semiconductor laser devices giving rise to oscillation at a wavelength of λ1, comprising the steps of:

a. forming a layered structure including a quantum well and waveguide layers on a wafer exhibiting a material gain function capable of sustaining oscillation at a number of F-P modes, said material gain function having a tendency to give rise to oscillation at a wavelength of λ2;

b. etching a surface relief portion through said layers exhibiting said gain function at a point beyond the end of the quantum well gain strip to effect an unpumped region; and c. creating a second-order grating in said unpumped region outside the gain region where the field strength is less than one thousandth of the field strength of the quantum well and waveguide layers, said grating providing a gain discrimination factor α having a value of approximately 1.0 cm$^{-1}$ between wavelengths of λ2 and λ1.

10. A method according to claim 9 wherein said grating has a length approximately ten percent of the length of the F-P cavity formed between the facets of said laser.

11. A method according to claim 10 wherein said grating is located closer to a highly reflective one of said facets.

12. A semiconductor laser device comprising:

a negatively doped semiconductor material substrate;

a plurality of semiconductor material epitaxial layers and a laser gain stripe;

a second-order grating etched into one of said semiconductor material epitaxial layers, said grating having a plurality of grating grooves for providing feedback to stabilize the of emission of laser light at desired wavelength from an emitting facet of said laser; said grating wholly lying in an unpumped region of said laser beyond at least one end of said gain stripe: and in direct contact with a dielectric material layer instead of semiconductor epitaxial layers overlying the length of said grating.

13. A semiconductor laser device according to claim 12, wherein said negatively doped semiconductor substrate is of a gallium and arsenic material compound (GaAs).

14. A semiconductor laser device according to claim 12 wherein said semiconductor epitaxial layers comprise:

a stop etch layer;

a negatively doped GaAs layer;

a negatively doped aluminum, gallium and arsenic material compound (AlGaAs) cladding layer;

a negatively doped AlGaAs confinement layer;

a AlGaAs active layer; and a positively doped AlGaAs cladding layer.

* * * * *